(12) United States Patent
Chudzik et al.

(10) Patent No.: US 8,232,606 B2
(45) Date of Patent: Jul. 31, 2012

(54) HIGH-K DIELECTRIC AND METAL GATE STACK WITH MINIMAL OVERLAP WITH ISOLATION REGION

(75) Inventors: Michael P. Chudzik, Danbury, CT (US); William K. Henson, Beacon, NY (US); Renee T. Mo, Briarcliff Manor, NY (US); Jeffrey Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/150,378

(22) Filed: Jun. 1, 2011

(65) Prior Publication Data

US 2011/0227171 A1    Sep. 22, 2011

Related U.S. Application Data

(62) Division of application No. 11/954,775, filed on Dec. 12, 2007, now Pat. No. 8,021,939.

(51) Int. Cl.
*H01L 29/76* (2006.01)
(52) U.S. Cl. ........................................ 257/369; 257/410
(58) Field of Classification Search .................. 257/369, 257/410
See application file for complete search history.

(56) References Cited

U.S. PATENT DOCUMENTS

| 6,660,462 | B1 | 12/2003 | Fukuda |
| 7,122,281 | B2 | 10/2006 | Pierrat |
| 2006/0204859 | A1 | 9/2006 | Leidy et al. |
| 2007/0148836 | A1 | 6/2007 | Cheng et al. |
| 2007/0228480 | A1 | 10/2007 | Yen et al. |
| 2009/0108365 | A1 | 4/2009 | Tseng et al. |

OTHER PUBLICATIONS

Gebremariam, U.S. Appl. No. 11/954,775, Office Action Communication, FIS920070366US1, Nov. 30, 2010, 11 pages.
Gebremariam, U.S. Appl. No. 11/954,775, Notice of Allowance & Fees Due, FIS920070366US1, May 17, 2011, 5 pages.

*Primary Examiner* — Samuel Gebremariam
(74) *Attorney, Agent, or Firm* — Hoffman Warnick LLC; Joseph J. Petrokaitis

(57) ABSTRACT

A high-k dielectric and metal gate stack with minimal overlap with an adjacent oxide isolation region and related methods are disclosed. One embodiment of the gate stack includes a high dielectric constant (high-k) dielectric layer, a tuning layer and a metal layer positioned over an active region defined by an oxide isolation region in a substrate, wherein an outer edge of the high-k dielectric layer, the tuning layer and the metal layer overlaps the oxide isolation region by less than approximately 200 nanometers. The gate stack and related methods eliminate the regrowth effect in short channel devices by restricting the amount of overlap area between the gate stack and adjacent oxide isolation regions.

7 Claims, 3 Drawing Sheets

HIGH-K DIELECTRIC AND METAL GATE STACK WITH MINIMAL OVERLAP WITH ISOLATION REGION

The current application is a divisional application of co-pending U.S. patent application Ser. No. 11/954,775, filed on Dec. 12, 2007, which is hereby incorporated by reference.

BACKGROUND

1. Technical Field

The disclosure relates generally to integrated circuit (IC) fabrication, and more particularly, to a high dielectric constant (high-k) dielectric and metal gate stack and related methods.

2. Background Art

In the integrated circuit (IC) fabrication industry, metal gate electrodes are being pursued for, for example, the 45 nanometer (nm) and 32 nm technology nodes as a replacement for doped polysilicon (poly-Si) gate electrodes for a number of reasons. A metal gate electrode includes a high dielectric constant (high-k) dielectric within a metal gate stack. One reason, among many, that this technology is being pursued is to enable gate length scaling. Thinner gate dielectrics enable the gate length to be scaled which in turn improves the performance and density of integrated circuits. The best known self aligned process flows for complementary metal oxide semiconductor (CMOS) fabrication with the high-k dielectrics and metal gate stacks use a dual field effect transistor (FET) threshold voltage (Vt) work function tuning layers scheme to tune the threshold voltage of adjacent n-type metal oxide semiconductor (NMOS) region (for NFETs) and p-type metal oxide semiconductor (PMOS) region (for PFETs). That is, dual metal/dual dielectric gate stacks.

One challenge for this technology is that narrow width short channel transistors utilizing high-k dielectrics and metal gate electrodes in traditional CMOS gate-first processing suffer from unintentional re-growth of silicon oxide in the active regions. In particular, the high-k dielectrics such as hafnium oxide ($HfO_2$) are deposited over a silicon active region separated by isolation regions, the latter of which typically include silicon oxide ($SiO_2$). Consequently, the oxygen interacts with the silicon in the active region to form (re-grow) silicon oxide like dielectrics, which disadvantageously increases the equivalent oxide thickness (EOT) of the gate dielectric, i.e., the thickness of the gate dielectric is that of the high-k dielectric plus the re-grown silicon oxide in the silicon active region. This situation diminishes the goal of minimizing gate dielectric thickness. This unintentional re-growth also leads to a degradation in the ability to control when the transistor is turned on and off. The loss in control of the transistor leads to overall circuit degradation due to the large variation in turn on voltage. The large variation leads to large degradation in drive current as the width of the device decreases due to oxygen containing processes that occur after gate patterning (e.g., resist strip, rapid thermal anneal (RTA) ambients, etc). In some cases, this lateral oxidation can occur despite encapsulation.

SUMMARY

A high-k dielectric and metal gate stack with minimal overlap with an adjacent oxide isolation region and related methods are disclosed. One embodiment of the gate stack includes a high dielectric constant (high-k) dielectric layer, a tuning layer and a metal layer positioned over an active region defined by an oxide isolation region in a substrate, wherein an outer edge of the high-k dielectric layer, the tuning layer and the metal layer overlaps the oxide isolation region by less than approximately 200 nanometers. The gate stack and related methods eliminate the regrowth effect in short channel devices by restricting the amount of overlap area between the gate stack and adjacent oxide isolation regions.

A first aspect of the disclosure provides a method comprising: providing a substrate having a first active region defined therein by an oxide isolation region; and forming a first high dielectric constant (high-k) dielectric and metal gate stack over the first active region in the substrate, the first high-k dielectric and metal gate stack overlapping the oxide isolation region to a minimum amount allowed by an overlay tool.

A second aspect of the disclosure provides a method comprising: providing a substrate having a first active region defined therein by an oxide isolation region and a second active region defined therein by an oxide isolation region; forming a first high dielectric constant (high-k) dielectric and metal gate stack over the first active region in the substrate, the first high-k dielectric and metal gate stack overlapping the oxide isolation region by less than 200 nanometers; forming a second high-k dielectric and metal gate stack over the second active region adjacent to the first high-k dielectric and metal gate stack, the second high-k dielectric and metal gate stack overlapping the oxide isolation region by less than approximately 200 nanometers; depositing a polysilicon over the first and second high-k dielectric and metal gate stacks; and patterning the first and second high-k dielectric and metal gate stack to form a pair of gate electrodes.

A third aspect of the disclosure provides a gate stack comprising: a high dielectric constant (high-k) dielectric layer, a tuning layer and a metal layer positioned over an active region defined by an oxide isolation region in a substrate, wherein an outer edge of the high-k dielectric layer, the tuning layer and the metal layer overlaps the oxide isolation region by less than approximately 200 nanometers.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Conventional approaches to forming high dielectric constant (high-k) dielectric and metal gate stacks attribute the above-described silicon oxide re-growth in active regions to oxide from the high-k gate dielectrics (which typically include an oxide such as hafnium oxide ($HfO_2$)) that are positioned over the active region. However, this disclosure identifies a root cause of the silicon oxide re-growth as the overlap between the gate stack and the adjacent oxide isolation regions. In particular, while the high-k dielectrics indeed play a direct part in the silicon oxide re-growth, a more significant effect is created in how the high-k dielectrics tend to scavenge oxygen ($O_2$) from the adjacent isolation regions, and pipe it into the active silicon regions adjacent to the isolation regions. It is this overlap area that determines the amount of silicon oxide regrowth. According to this disclosure, the overlap is restricted to minimize the silicon oxide re-growth.

Figure 1:
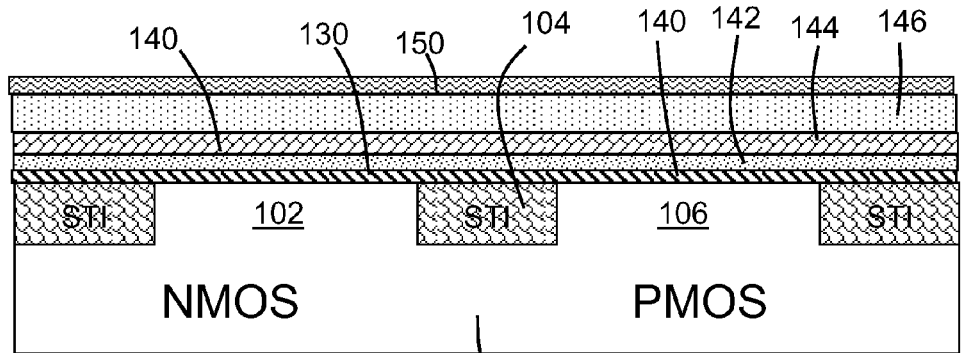
FIGS. 1-6 show methods according to the disclosure with FIGS. 2A, 2B, 4 and 5 showing embodiments of a high-k dielectric and metal gate stack according to the disclosure.

Referring to FIGS. 1-6, embodiments of a method according to the disclosure are illustrated. In FIG. 1, a substrate 100 is provided having a first active region 102 defined therein by an oxide isolation region 104. A second active region 106 may also be provided in substrate 100. As illustrated, first active region 102 is doped p-type, and second active region 106 is doped n-type. However, they could be switched. N-type dopants may include but are not limited to: phosphorous (P), arsenic (As), antimony (Sb); and p-type dopants may include but are not limited to: boron (B), indium (In) and gallium (Ga).

Oxide isolation region 104 may be any form of isolation region, e.g., a deep trench isolation (DTI), shallow trench isolation (STI) (shown), and typically includes an oxide-based dielectric such as silicon oxide ($SiO_2$). Isolation region 104 may be a single structure or a number of structures within substrate 100. Substrate 100 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate 100 may be strained. The substrate also may include semiconductor-on-insulator (SOI) structure. As the processes to provide substrate 100, as illustrated, are well known in the art, no further description is necessary.

Figure 2A:
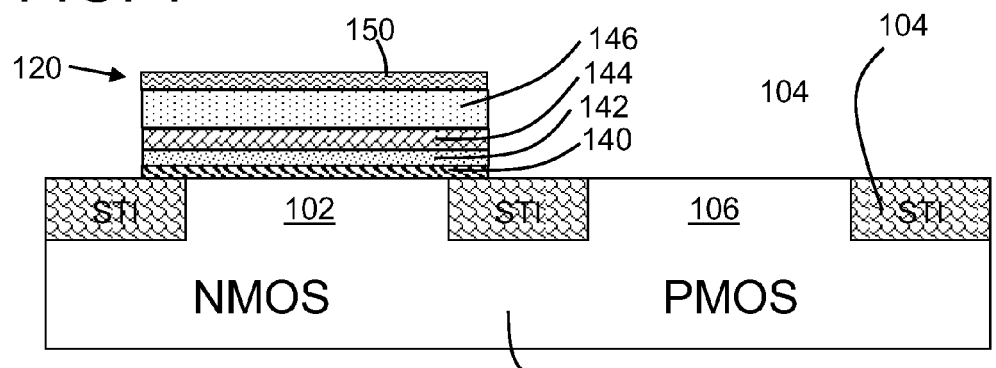
Figure 2B:
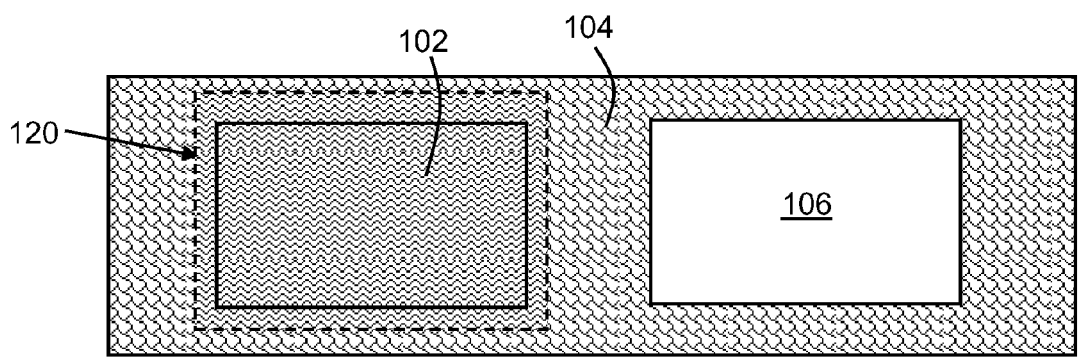

FIGS. 1-2B show forming a first high dielectric constant (high-k) dielectric and metal gate stack 120 (FIGS. 2A-B) (hereinafter "high-k/metal gate stack") over first active region 102 in substrate 100. FIGS. 1 and 2A show cross-sectional views, while FIG. 2B shows a top down view. As shown in FIG. 2A, high-k and metal gate stack 120 may include a gate dielectric layer 140 (i.e., high-k dielectric), a tuning layer 142, a metal layer 144 and an amorphous silicon layer 146. High-k/metal gate stack 120 may be formed using any now known or later developed deposition and patterning techniques, except that, in contrast to conventional approaches, first high-k/metal gate stack 120 overlaps oxide isolation region 104 to a minimum amount allowed by an overlay tool. For example, current state of the art tools being used today have minimum overlay tolerances of 10 nm; however 25 nm is more typical. For example, layers 140, 142, 144, 146 may be deposited using any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Layers 140, 142, 144 and 146 may then be patterned using a block level mask 150 to trim high-k/metal gate stack 120 such that it does not overlap any adjacent isolation regions 104. In one embodiment, based on conventional overlay tools such as the ASML 1400i, the overlap (minimum amount=60 nm) is less than approximately 200 nanometers, i.e., perhaps +10.0 nanometers. In one embodiment, however, the overlap (minimum amount) is approximately 60 nanometers, i.e., +/−14.0 nanometers. Future developments in overlay tool accuracy may allow for further improvement in reducing the overlap.

Gate dielectric layer 140 (i.e., high-k dielectric) may include, for example, hafnium oxide ($HfO_2$), hafnium silicon oxide (HfSiO), hafnium silicon oxynitride (HfSiON), zirconium oxide ($ZrO_2$), zirconium silicon oxide (ZrSiO), zirconium silicon oxynitride (ZrSiON), aluminum oxide ($Al_2O_3$), titanium oxide ($Ti_2O_5$) and/or tantalum oxide ($Ta_2O_5$), and metal layer 144 may include, for example, titanium nitride (TiN), titanium (Ti), tantalum (Ta), tantalum nitride (TaN), tantalum carbon (TaC) and/or tantalum carbon nitride (TaCN). Tuning layer 142 may include, for example, lanthanum oxide ($La_2O_5$), lanthanum (La), magnesium oxide (MgO), magnesium (Mg), bismuth strontium (BiSr), strontium oxide (SrO), yttrium (Y), yttrium oxide ($Y_2O_3$), barium (Ba), barium oxide (BaO), scandium (Sc), scandium oxide (ScO), or any other group IIA, IIIB element and lanthanides thereof, where active region 102 is doped p-type, as illustrated. In contrast, tuning layer 142 may include, for example, aluminum oxide ($Al_2O_3$) or tantalum nitride (TaN) where active region 102 is doped n-type. As understood in the art, the different tuning layers 142 allow for tuning of the work function of metal layer 144 such that a threshold voltage can approach the desired values. If no tuning layer were used then the resulting threshold voltage would be higher than desired. Although the thicknesses may vary, in one embodiment, gate dielectric layer 140 may have a thickness of approximately 10-25 Ångstroms, tuning layer 142 may have a thickness of approximately 1-5 Ångstroms, metal layer 144 may have a thickness of approximately 3-7 nanometers, and amorphous silicon layer 146 may have a thickness of approximately 5-20 nanometers.

Figure 3:
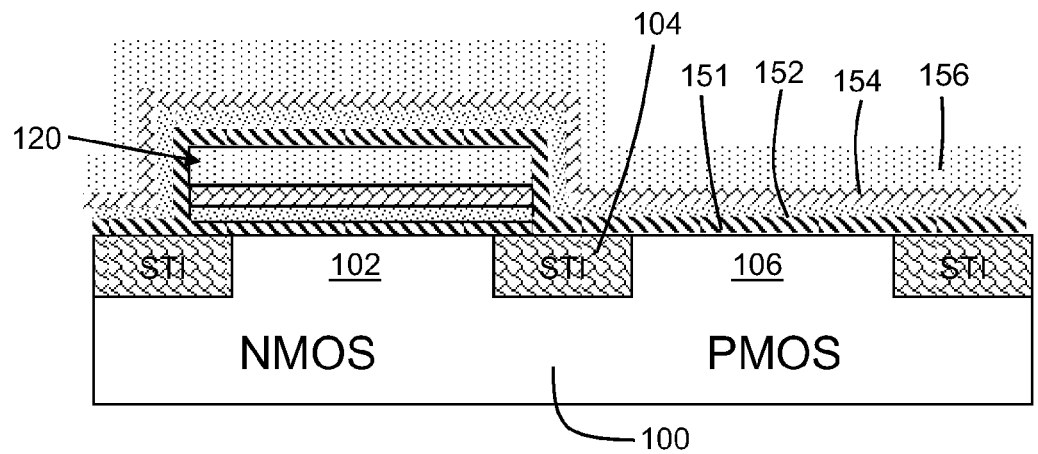
Figure 4:
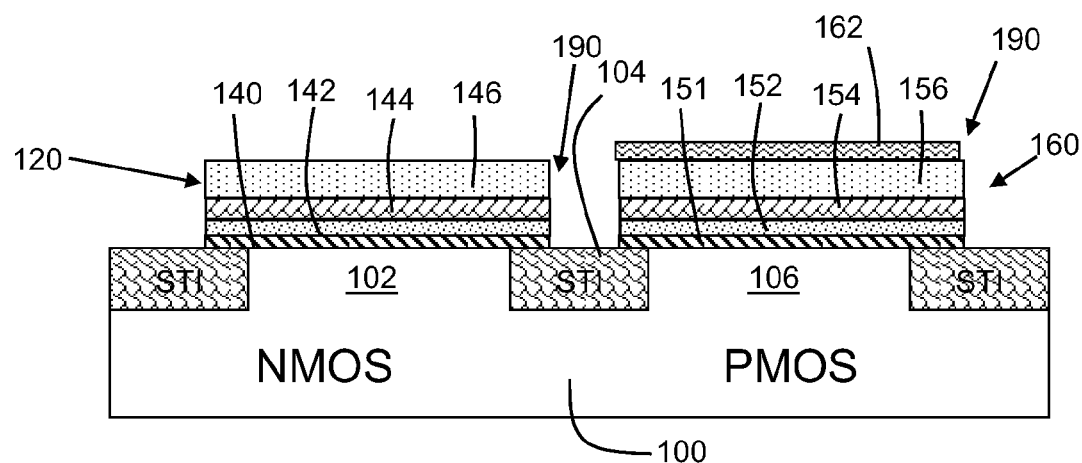

FIG. 3 shows depositing layers 151, 152, 154, 156 for a second high-k and metal gate stack 160 (FIG. 4) over second active region 106 adjacent to the first high-k/metal gate stack 120, and FIG. 4 shows patterning to form second high-k/metal gate stack 160 over second active region 106. As shown in FIG. 3, this process may include depositing a gate dielectric layer 151 (i.e., high-k dielectric), a tuning layer 152, a metal layer 154 and an amorphous silicon layer 156. These layers may be formed as described above, with the notable exception that tuning layer 152 would be chosen to accommodate active region 106, which is n-type as illustrated. That is, tuning layer 152 may include, for example, lanthanum oxide ($La_2O_5$) since active region 106 is doped p-type, as illustrated. Tuning layer 152 would include, for example, aluminum oxide ($Al_2O_3$) if active region 106 is doped n-type. The thicknesses may match those described above. As with first high-k/metal gate stack 120, in contrast to conventional approaches, second high-k/metal gate stack 160 overlaps oxide isolation region 104 to a minimum amount allowed by an overlay tool, e.g., less than approximately 200 nanometers. As described above, layers 151, 152, 154, 156 may be deposited and patterned using a block level mask 162 to trim second high-k/metal gate stack 160 such that it does not overlap any adjacent isolation regions 104.

Figure 5:
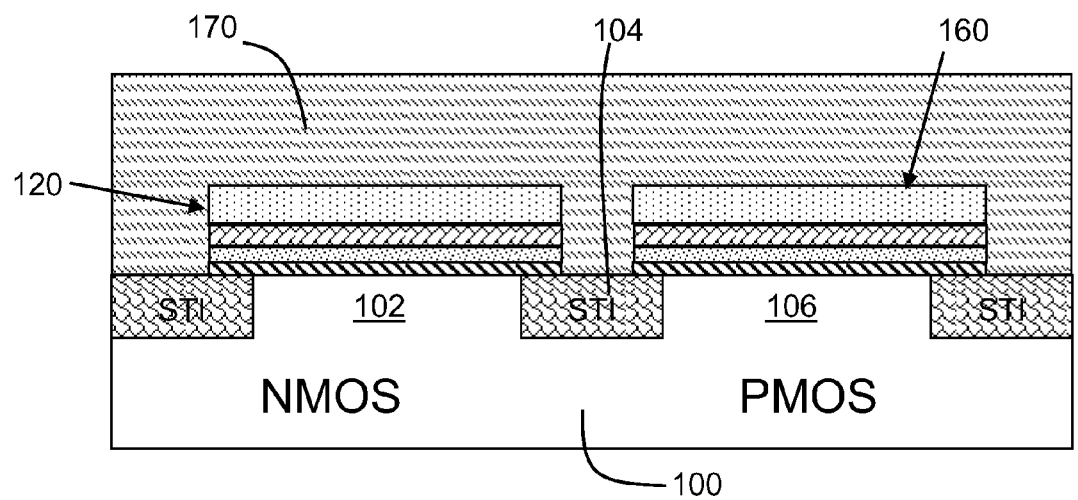
Figure 6:
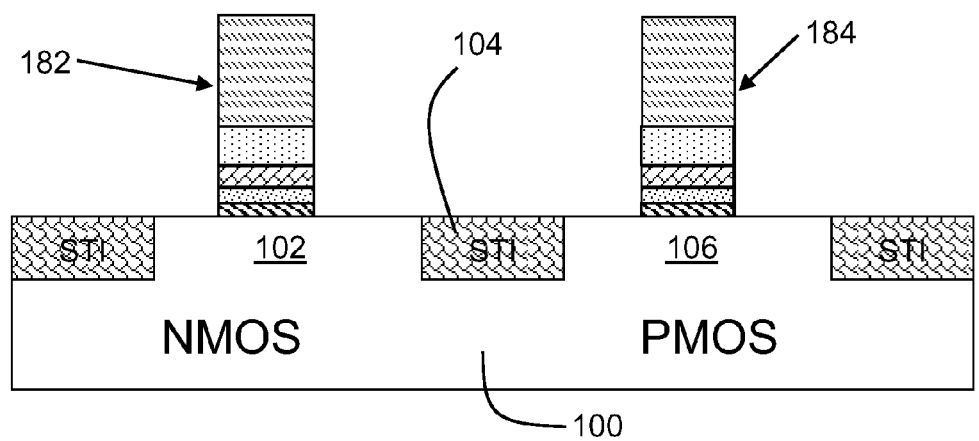

FIGS. 5-6 show subsequent processing. In particular, FIG. 5 shows depositing a polysilicon 170 over first and second high-k/metal gate stacks 120, 160, and FIG. 6 shows patterning first and second high-k/metal gate stack 120, 160 to form gate electrodes 182, 184. It is understood that each gate electrode may be separately patterned, if desired.

Returning to FIG. 4, in another embodiment of the disclosure one or more gate stacks 120, 160 are provided. As described above, gate stack 120, 160 includes high-k dielectric layer 140, 151, tuning layer 142, 152 and metal layer 144, 154 positioned over an active region 102, 106 defined by oxide isolation region 104 in substrate 100. An outer edge 190 of high-k dielectric layer 140, 151, tuning layer 142, 152 and metal layer 144, 154 overlaps oxide isolation region 104 by less than 200 nanometers. Each gate stack 120, 160 may also include amorphous silicon layer 146, 156.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A gate stack comprising: a high dielectric constant (high-k) dielectric layer, a tuning layer, a metal layer and an amorphous silicon layer positioned over an active region defined by an oxide isolation region in a substrate, wherein an outer edge of the high-k dielectric layer, the tuning layer, the metal layer, and the amorphous silicon layer overlaps the oxide isolation region by less than approximately 200 nanometers, and wherein the high-k dielectric layer is directly over the active region, the tuning layer is directly over the high-k dielectric layer, the metal layer is directly over the tuning layer, and the amorphous silicon layer is directly over the metal layer.

2. The gate stack of claim 1, wherein the tuning layer is selected from the group consisting of: aluminum oxide ($Al_2O_3$) and tantalum nitride (TaN) wherein the active region is doped n-type, and lanthanum oxide ($La_2O_5$), lanthanum (La), magnesium oxide (MgO), magnesium (Mg), bismuth strontium (BiSr), strontium oxide (SrO), yttrium (Y), yttrium oxide ($Y_2O_3$), barium (Ba), barium oxide (BaO), scandium (Sc), scandium oxide (ScO), and any other group IIA, IIIB element and lanthanides thereof wherein the active region is doped p-type.

3. The gate stack of claim 1, wherein the amorphous silicon layer has a thickness of approximately 5-20 nanometers.

4. The gate stack of claim 1, wherein the metal layer includes titanium nitride (TiN).

5. The gate stack of claim 1, wherein the gate stack overlaps the oxide isolation region by at least approximately 60 nanometers.

6. The gate stack of claim 1, wherein the high-k dielectric layer has a thickness of approximately 10-25 Ångstroms, the tuning layer has a thickness of approximately 1-5 Ångstroms, and the metal layer has a thickness of approximately 3-7 nanometers.

7. The gate stack of claim 1, wherein the gate stack further includes a gate electrode directly over the amorphous silicon layer.

* * * * *